US007310048B2

(12) United States Patent
Balakrishnan et al.

(10) Patent No.: US 7,310,048 B2
(45) Date of Patent: Dec. 18, 2007

(54) METHOD AND APPARATUS FOR SENSING A CURRENT IN A CIRCUIT

(75) Inventors: Balu Balakrishnan, Saratoga, CA (US); Arthur B. Odell, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 270 days.

(21) Appl. No.: 11/121,808

(22) Filed: May 4, 2005

(65) Prior Publication Data

US 2006/0250265 A1    Nov. 9, 2006

(51) Int. Cl.
G08B 21/00    (2006.01)
(52) U.S. Cl. ............... 340/664; 340/545.4; 324/522
(58) Field of Classification Search .......... 340/664, 340/657, 545.4, 636.1, 636.13, 636.15, 636.19; 320/132, 148, 156; 323/277; 324/522
See application file for complete search history.

(56) References Cited

U.S. PATENT DOCUMENTS

| | | | |
|---|---|---|---|
| 5,198,743 A * | 3/1993 | McClure et al. | 320/145 |
| 5,200,692 A * | 4/1993 | Krinsky et al. | 323/269 |
| 5,698,965 A * | 12/1997 | York | 307/130 |
| 5,977,749 A | 11/1999 | Kim | 320/128 |
| 6,956,487 B2 * | 10/2005 | Herrmann et al. | 340/636.12 |
| 2003/0021129 A1 * | 1/2003 | Balakrishnan et al. | 363/21.01 |

FOREIGN PATENT DOCUMENTS

EP    1 278 070 A2    1/2003

* cited by examiner

*Primary Examiner*—Phung T. Nguyen
(74) *Attorney, Agent, or Firm*—Blakely Sokoloff Taylor & Zafman LLP (57)    ABSTRACT

Techniques are disclosed to sense a current in a circuit. For instance, current sense circuit according to the teachings of the present invention includes a current sense resistor coupled to an input of the current sense circuit. The current sense resistor is coupled to receive a current to be sensed from the input of the current sense circuit. The current to be sensed is converted to a current sense voltage. A first PN junction diode is coupled to the current sense resistor. A light emitting diode (LED) is coupled to the first PN junction diode to provide a current sense threshold substantially proportional to a difference between a forward voltage drop of the LED and a forward voltage drop of the first PN junction diode. The first PN junction diode is coupled to be biased from the forward voltage drop of the LED. The LED is coupled to the current sense resistor to generate an output when the current sense voltage from the current sense resistor reaches the current sense threshold.

20 Claims, 8 Drawing Sheets

METHOD AND APPARATUS FOR SENSING A CURRENT IN A CIRCUIT

BACKGROUND

1. Technical Field

The present invention relates generally to electronic circuits, and more specifically, the invention relates to a current sense circuit.

2. Background Information

Most battery operated portable electronic products such as cell phones, personal digital assistants (PDAs), etc. require a low power alternating current (AC) to direct current (DC) charger power supply with a constant voltage and constant current (CV/CC) characteristics for charging batteries. Most of these power supplies are housed in small enclosures to provide a portable and easily stored charger appropriate for the products being charged. The size of the enclosures used place efficiency requirements on the operation of the power supply to ensure the temperature inside the power supply enclosure stays within acceptable limits during operation. Due to the competitive nature of the consumer markets being served, there are also strict cost targets applied to these charger power supplies. As consumers continue to expect smaller and more portable products, there is therefore a strong requirement to introduce low cost means to improve charger power supply efficiency.

BRIEF DESCRIPTION OF THE DRAWINGS

The present invention detailed illustrated by way of example and not limitation in the accompanying Figures.

DETAILED DESCRIPTION

Embodiments of a power supply regulator that may be utilized in a power supply are disclosed. In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
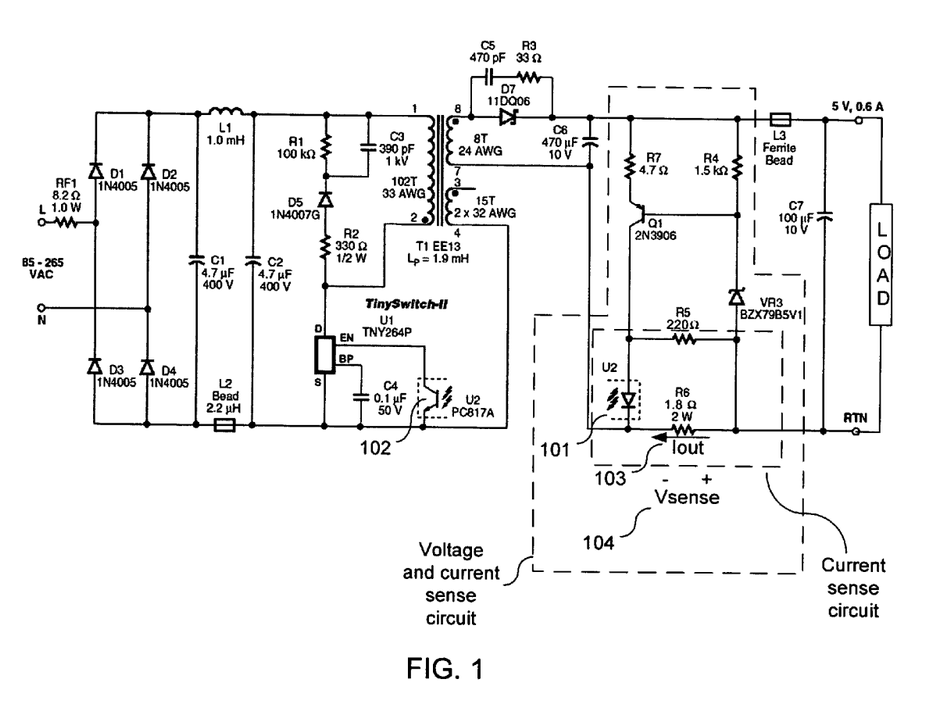
FIG. 1 shows an example of a low cost AC to DC CV/CC charger power supply.

An AC to DC CV/CC charger power supply circuit typically includes circuitry on the input or primary side which is electrically coupled to the AC input and circuitry on the secondary or output side of the power supply electrically coupled to a load such as a battery. FIG. 1 shows an example of a low cost AC to DC CV/CC charger power supply. The power supply circuit example shown in FIG. 1 is an isolated power supply as the input or primary side circuit side of the power supply is electrically isolated from the output or secondary side of the power supply. However, there are two couplings between input and output circuitry that are important to the operation of the power supply. The first is a magnetic coupling provided by the energy transfer element T1, the second is an optical coupling provided by the photocoupler or optocoupler U2 where light output provided by current flowing in the light emitting diode (LED) 101 is detected by the phototransistor 102 providing a feedback signal which is coupled to the EN terminal of controller U1 on the primary or input side of the power supply. The example controller U1 shown in FIG. 1 is TNY264, a member of the TinySwitch-II family of devices from Power Integrations, which integrates a switched mode power supply controller along with a high voltage MOSFET switch. The power supply output voltage and current regulation thresholds are determined by voltage and current sense circuitry on the secondary side of the power supply. The voltage regulation threshold is substantially equal to the breakdown voltage of zener diode VR3 and the base emitter junction voltage of bipolar transistor Q1. Resistors R7 and R4 also have secondary effects on the regulation voltage threshold. Resistor R7 reduces the gain of the voltage regulation circuit to help prevent instability. The voltage dropped across resistor R7 varies according to the current flowing in LED 101 and resistor R5 but, is negligible compared to the output voltage. In the circuit of FIG. 1, the controller U1 requires a very low value of feedback current in the order of 250 uA which results in a very small voltage drop across R7 of only approximately 1 mV since the current transfer ratio of the optocoupler U2 is approximately equal to 1. The current through resistor R5 can vary from 4.5 mA at no load (Vsense=0 V) when it has the full LED forward voltage of approximately 1V across it to 0 mA just before going in to a constant current regulation (Vsense~1 V). Therefore, the voltage across R7 varies from 1 mV to 22 mV, which is small compared to the output regulation threshold of 5V for the circuit shown in FIG. 1. Resistor R4 sets the bias current for zener VR3. In the example of FIG. 1, assuming the combined voltage dropped across R7 and the base emitter junction of bipolar transistor Q1 is 0.7 Volts, the current flowing in R4 is approximately 0.7/1500=0.47 mA. This current sets the operating point of the zener VR3 and has a secondary impact on the breakdown voltage of the zener as specified in the zener data sheet.

The output current regulation threshold of the power supply in FIG. 1 is determined by the current sense circuit comprising R5 and the LED 101. The current to be sensed Iout 103 flowing in current sense resistor R6 at the input to the current sense circuit, generates a current sense voltage Vsense. The current sense circuit has no output until the voltage generated across current sense resistor R6 reaches a current sense threshold. The current sense threshold in the circuit of FIG. 1 is substantially equal to the forward voltage drop of LED 101. When the voltage Vsense exceeds this current sense threshold, LED 101 provides light output which is the output of the current sense circuit. The exact current sense threshold is influenced slightly by the voltage dropped across resistor R5. As noted above, the controller of FIG. 1 requires approximately 250 uA feedback current which will lead to 220×250 uA=55 mV voltage drop across this resistor. Since the forward voltage drop of an LED used in optocoupler U2 is typically approximately 1 volt, the combined current sense voltage threshold in this case is approximately 1.055 Volts.

This current sense voltage threshold results in power dissipation in sense resistor R6 equal to $1.055^2/1.8=0.62$ Watts. Due to the very small enclosure and high ambient temperature conditions in the end application of the circuit of FIG. 1 it is often necessary to increase the power rating of current sense resistor R6 to well above the value that would expected from this calculation as is the case shown in FIG. 1 where a 2 Watt resistor has been used. The high power dissipated in the sense resistor also increases the power processed by the high voltage MOSFET in U2 and, in turn, increases losses in U2, further increasing the temperature of the enclosure. It is therefore, very desirable to have a low cost current sense circuit that provides a low current threshold to reduce overall power dissipation of an AC to DC CV/CC charger to increase its efficiency and to allow for smaller size enclosures.

Figure 2:
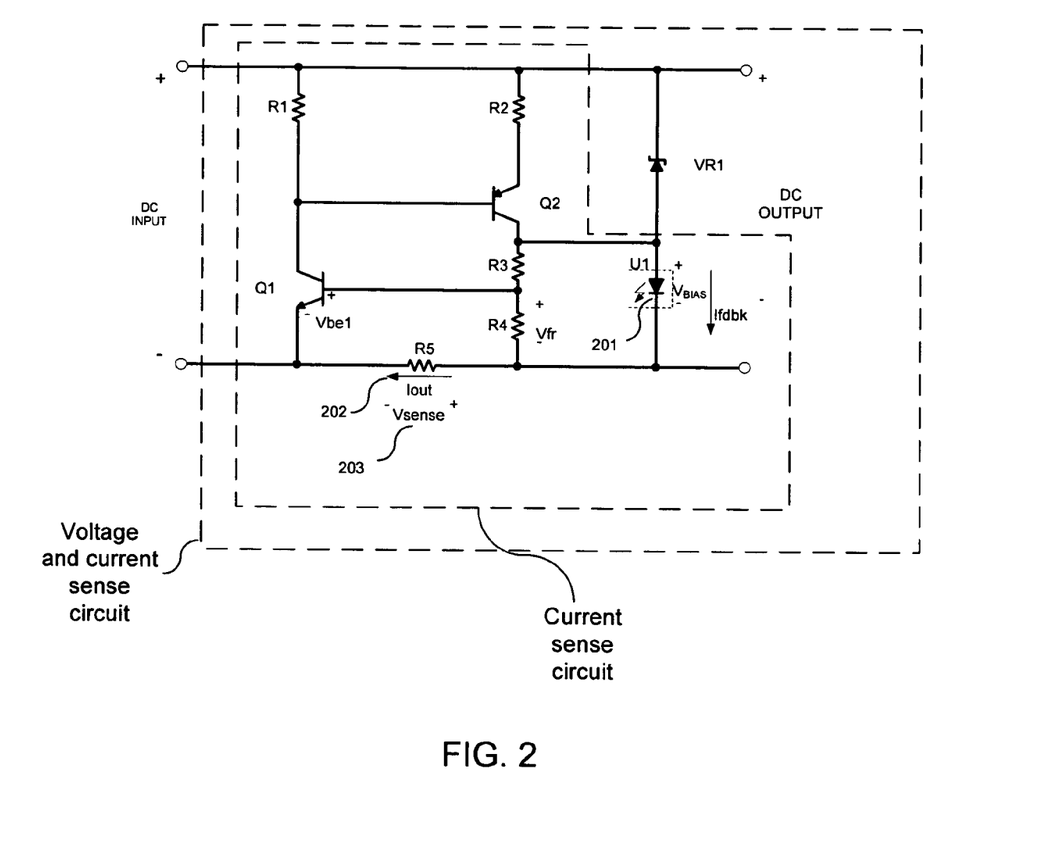
FIG. 2 shows an example of a current and voltage sense circuit with reduced current sense voltage threshold for an embodiment in accordance with the teachings of the present invention.

FIG. 2 shows one embodiment of a circuit benefiting from the teachings of the present invention where the current sense threshold voltage has been substantially reduced. The voltage and current sense circuit shown in FIG. 2 could be used in place of the voltage and current sense circuit of the power supply in FIG. 1. Output current Iout flows through current sense resistor R5 which converts the current to be sensed Iout into a current sense voltage Vsense which is applied to the input of a current sense circuit consisting of components Q1, Q2, R1, R2, R3, R4 and LED 201. In the current sense circuit of FIG. 2, the current sense threshold is the difference between the forward voltage drop of a first diode, which is the PN junction formed by the base emitter junction of Q1, having a value of Vbe1 and a fraction of the forward voltage of a second diode which is LED 201 forward voltage, $V_{BIAS}$. This fraction of $V_{BIAS}$ is shown as voltage Vfr in FIG. 2 created using a resistor divider formed by resistors R3 and R4. The forward voltage drop of the LED 201 which is relatively independent of current through the LED 201, acts as a voltage reference for the resistor divider circuit formed by R3 and R4 to generate fractional voltage Vfr. For example, if R3 and R4 are substantially equal in resistance value, Vfr will be substantially 50% of $V_{BIAS}$, or approximately 0.5 volts, assuming 1 Volt forward voltage drop of LED 201. Since Vbe is typically approximately 0.7 Volts in a standard bipolar transistor, the current sense threshold voltage of the circuit will be 0.7−0.5=0.2 Volts. Compared to the circuit shown in FIG. 1, where the current sense threshold voltage was 1.055V, the dissipation in component R5 of FIG. 2 will therefore be reduced to approximately the ratio of these voltages 0.2/1.055=0.19 relative to the dissipation in current sense resistor R6 in FIG. 1. The benefit in the power supply circuit is clearly that the heat generated inside the power supply enclosure is reduced, in turn reducing thermal stress on the complete power supply and efficiency of the power supply is increased.

The first bipolar transistor Q1 in FIG. 2, is coupled to drive the base of second bipolar transistor Q2 as shown. Resistor R1 sets the current required to flow in Q1 before the base emitter junction of Q2 conducts, which occurs when the current sense voltage reaches the current sense threshold. Once this current sense threshold is reached, Q2 turns on. The current flowing in Q2 then drives the LED 201, the light output of which forms the output of the current sense circuit. In one embodiment, LED 201 is part of an optocoupler U1 where this light output is a feedback signal as for example in FIG. 1 where LED 101 is a part of optocoupler U2 in a power supply circuit. In another embodiment, LED 201 is a discrete LED where the light output is a visual indicator of the output current I202 reaching the current sense threshold.

Figure 3:
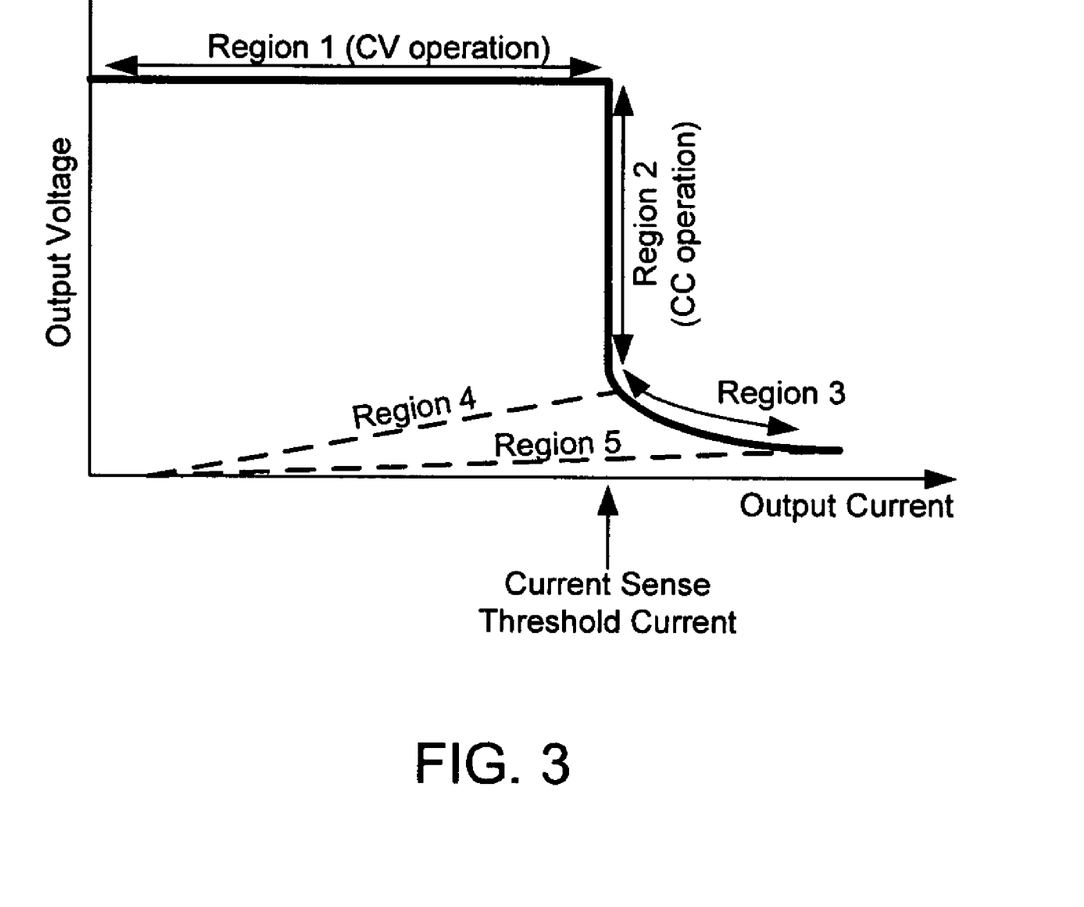
FIG. 3 is a diagram illustrating various operating regions in the output characteristics of a CV/CC charger power supply for an embodiment in accordance with the teachings of the present invention.

In one embodiment, Resistor R2 at the emitter of Q2 in the circuit of FIG. 2 is included to improve the current sense circuit performance when used in a CV/CC charger power supplies. In charger power supplies, control of the output current Iout 202 is often required even at very low values of the DC output voltage. FIG. 3 highlights various operating regions in the output characteristics of a CV/CC charger power supply. At low output currents, the power supply operates in Region 1 where the output voltage is regulated at a voltage regulation threshold. In FIG. 2 for example, this voltage regulation threshold voltage value would be determined by the breakdown voltage of VR1 added to the forward voltage drop of LED 201. In FIG. 3, when the output current reaches the current sense threshold, the power supply transitions to operate in Region 2 and the output current is regulated to a substantially constant value as the output voltage falls. However, with the circuit of FIG. 2, as the DC output voltage falls to a value below approximately 1.2 V, which is the sum of the forward voltage drop of LED 201 of approximately 1 V plus a minimum collector to emitter voltage of approximately 0.2 V required across Q2 to be able to drive the LED, there is no longer enough voltage for Q2 to drive the LED current, Ifdbk, required to regulate Iout. As a consequence, the output current begins to increase as shown in Region 3 of FIG. 3, the voltage across R5 increases and first bipolar transistor Q1 is turned hard on (saturates). Resistor R2 in FIG. 2 introduces enough emitter impedance to allow first bipolar transistor Q1 collector to turn off the LED by pulling down the base of second transistor Q2 enough to clamp the collector voltage of Q2 through the PN junction diode of Q2 between collector and base, to a voltage that is less than the forward drop of the LED. In doing so, the current Ifdbk and therefore current sense circuit output, is rapidly reduced to substantially zero. When using a primary controller circuit of the type shown in FIG. 1 as component U1, the loss of output from the current sense circuit is a loss of the feedback signal and initiates auto-restart operation where the power switch internal to U1 stops switching for a long period and is restarted periodically for short periods of time to check whether a feedback signal can be received. This auto-restart operation is represented in FIG. 3 as Region 4. With other types of primary control circuits, Region 4 could be a region in which the controller simply reduces the operating frequency or current limit of the power switch in order to force the power supply output current to reduce in this region. Regardless of the mode of operation in Region 4, the effect on the average output current is that it reduces. However, in FIG. 2 if R2 is replaced by a short circuit, first bipolar transistor collector Q1 is no longer capable of clamping the collector of second bipolar transistor Q2 below the LED forward voltage, since there is now a very low impedance path from the DC output through the emitter base PN junction diode of second bipolar transistor Q2. With R2 replaced by a short circuit therefore, the power supply output current will increase much more significantly as shown in Region 3 when the output voltage drops below approximately 1.2 V, before reaching the auto-restart Region 5 as shown in FIG. 3. This is undesirable in many applications, in which case it is necessary to include a resistor R2 in series with the emitter of second bipolar transistor Q2. The use of R2 as shown eliminates the need for an additional secondary supply voltage and in many cases an associated secondary winding, to power the current sense circuit and maintain LED drive independent of output voltage, in order to prevent high output currents at low output voltages. Therefore, one of the advantages of the teachings of the present invention is that the current sense circuit operates directly off of the output voltage and offers low current sense threshold voltages without requiring an additional secondary supply voltage and or the associated additional secondary winding for proper operation at low output voltages.

Figure 4:
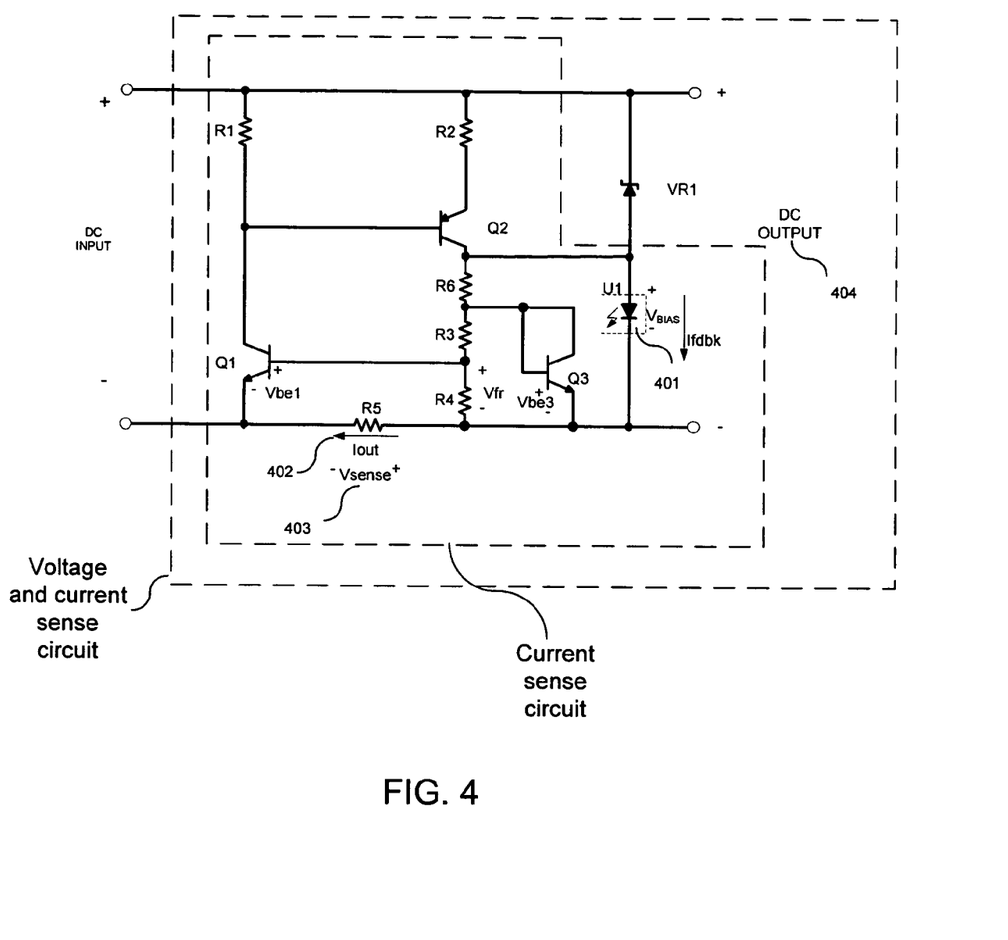
FIG. 4 shows another example of a current and voltage sense circuit with reduced current sense voltage threshold and improved current sense voltage threshold accuracy for an embodiment in accordance with the teachings of the present invention.

FIG. 4 is another embodiment of a circuit benefiting from the teachings of the present invention with improved current sense circuit accuracy. The current sense threshold is again a voltage difference between a forward voltage drop of a first diode, being the base emitter PN junction of Q1 and a fraction of the forward voltage drop of a second PN junction diode, which in FIG. 4 is the base emitter PN junction of a diode connected bipolar transistor Q3, Vbe3. This base emitter voltage Vbe3 is applied across the resistor divider formed by R3 and R4, where the fraction of Vbe3 is equal to Vfr which is determined by the choice of values of R3 and R4. The second PN junction diode in FIG. 4 is biased from the forward voltage drop of the LED 401 by the use of resistor R6. The circuit of FIG. 4 has the advantage that by using bipolar transistors Q1 and Q3 of the same bipolar transistor part number, the part to part variation of the absolute value base emitter voltages between Q1 and Q3 is relatively small reducing the variation in absolute value of current sense thresholds from one current sense circuit to another. In addition the temperature coefficients of Vbe1 and Vbe3 will be substantially the same, which is approximately −3000 ppm/° C., which in absolute value is about −2.2 mV/° C. However thermal compensation is non ideal since the temperature coefficient of Vbe3 is itself divided down in value by the ratio of R3 and R4 and the temperature variation of Vfr will therefore be less than the temperature variation of Vbe1. If the emitter current densities of Q1 and Q3, which are set by R1 and R6 respectively, are the same, the current sense threshold has a predictable temperature negative coefficient of approximately −3000 ppm/° C., similar to that of a Vbe independent of the absolute value of the current limit threshold. This temperature variation of the current sense threshold may be desirable in some applications. However, in most applications a zero temperature coefficient is preferred. The temperature variation of the current sense threshold of circuit in FIG. 4 can be partially or fully offset by using higher emitter current density in Q1 compared to Q3 as will be explained later.

In common with the circuit of FIG. 2, $V_{BIAS}$ is well regulated independent of the value of the DC output voltage 404 over the entire Region 2 of CC operation shown in FIG. 3. This fact ensures that the PN junction diode voltage Vbe3 is relatively stable since emitter current density, which is set by R6 is substantially constant over a wide range of DC output voltage corresponding to region 2 of FIG. 3. Furthermore, the voltage across R6 is substantially temperature independent because, the Vbias, which is the forward voltage of the LED and the Vbe3 of the PN junction diode have very similar temperature coefficients. The very stable nature of the bias voltage $V_{BIAS}$ with respect to output voltage and temperature enables a further embodiment of a circuit benefiting from the teachings of the present invention as described below.

Figure 5:
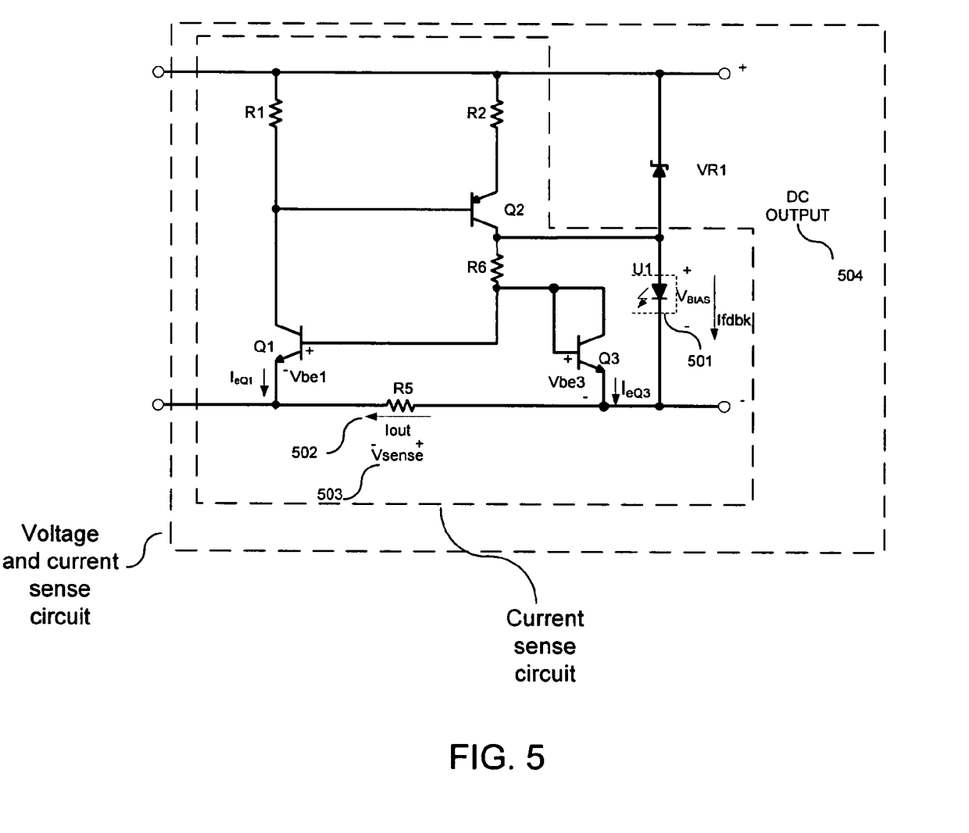
FIG. 5 shows yet another example of a current and voltage sense circuit with reduced current sense voltage threshold using a circuit technique known as "delta Vbe" to further reduce the current sense threshold voltage and improve its accuracy for an embodiment in accordance with the teachings of the present invention.

FIG. 5 shows yet another embodiment of a circuit benefiting from the teachings of the present invention using a circuit technique known as "delta Vbe" to further reduce the current sense threshold voltage and improve its accuracy. The principle of "delta Vbe" circuit techniques will be well known to one skilled in the art and has been used for many years in bandgap reference circuits for example. The technique relies on the fact that the difference in base emitter voltage drop of two bipolar transistors can be accurately predicted from the difference in their emitter current densities. In general, two bipolar transistors exhibit a difference in their base emitter voltages of 60 mV for every order of magnitude difference in their emitter current density levels. This principle is made use of in the circuit of FIG. 5 where Q1 and Q3 are chosen of the same part type to match emitter current density with absolute emitter current. Q3 is biased with an emitter current $I_{eQ3}$ determined by the value of R6 whilst Q1 emitter current at the current sense threshold is substantially set by the choice of R1 although the emitter base current of transistors Q1 and Q2 will have a second order influence. For example, if component values are chosen such that $I_{eQ3}$ is 100 uA and the value of IeQ1 is 1 mA, the current sense threshold voltage of the current sense circuit of FIG. 5 will be 60 mV.

In practice, the absolute base emitter voltage threshold of bipolar transistors with the same emitter current density, even from the same manufacture, can vary by approximately 20 mV. This error can be minimized by using a matched pair of transistors available from transistor manufacturers or by implementing these devices in an integrated circuit as matched transistors. Alternatively, this error can be corrected in production of the current sense circuit by trimming the value of R6 in order to ensure Vbe3 and Vbe1 maintain a difference of 60 mV. In addition to providing small sense voltages, which reduces the power dissipation in the current sense resistor R5, the circuit in FIG. 5, as with all delta Vbe circuits, has a positive temperature coefficient on the current sense threshold of approximately 3000 ppm/° C. which may be desirable in some applications.

In most applications, however, a zero temperature coefficient of the current limit threshold is desired. This can be achieved in the circuit of FIG. 4 by using the delta Vbe technique to partially or fully offset the positive temperature coefficient of the current sense threshold. By choosing a small current sense threshold, the −3000 ppm/° C. negative temperature coefficient of the current sense threshold can be substantially cancelled by using a lower emitter current density on Q3 relative to Q1 to create a voltage difference or delta Vbe between Vbe1 and Vbe3 that has a positive temperature coefficient. For example, if the threshold is set to 60 mV with Vbe1 same as Vbe2, the temperature coefficient will be approximately −3000 ppm/° C. If Q1 current density is then increased to be ten times larger than Q3, Vbe1 will increase by of 60 mV, and this delta Vbe will add to current sense threshold voltage but with a temperature coefficient of approximately +3000 ppm/° C. resulting in a 120 mV threshold with near zero temperature coefficient. By adjusting the current limit threshold contribution from delta Vbe component in relation to the current limit threshold excluding the delta Vbe, it is possible to tailor the temperature coefficient of the current limit threshold in the range of −3000 to +3000 ppm/° C. range.

Figure 6:
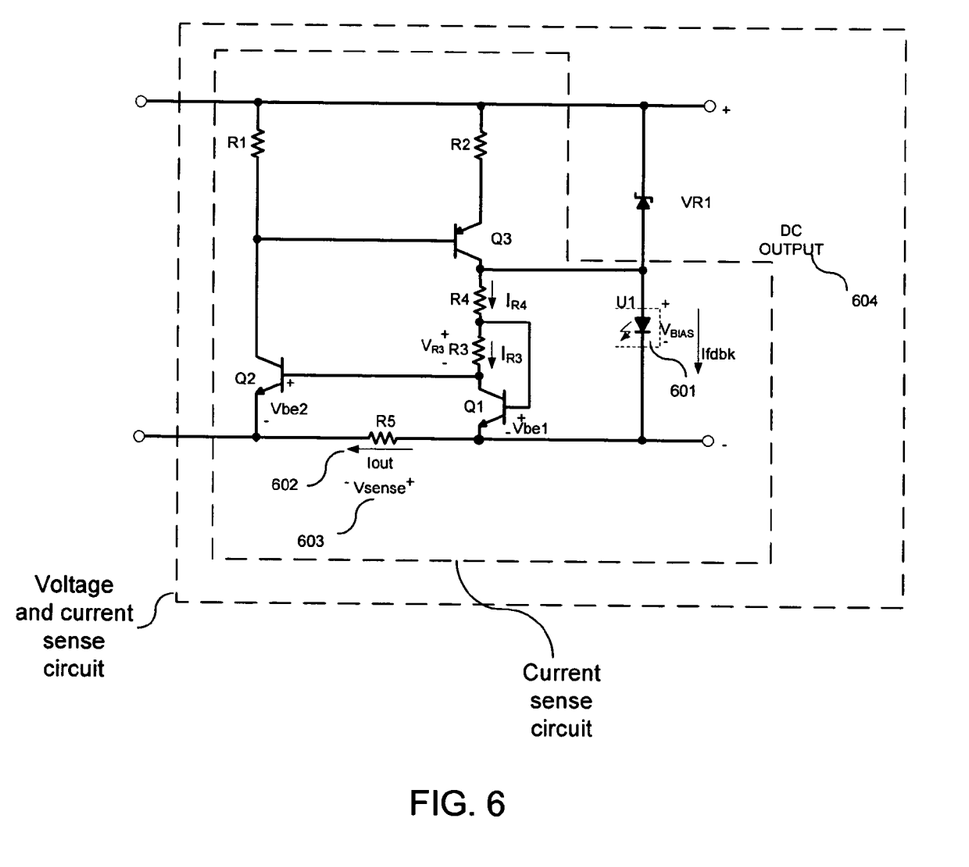
FIG. 6 shows yet another example of a current and voltage sense circuit with reduced current sense voltage threshold and improved thermal stability for an embodiment in accordance with the teachings of the present invention.

FIG. 6 shows yet another embodiment of a circuit benefiting from the teachings of the present invention. The circuit of FIG. 6 shows a current sense circuit where the current Iout 602 to be sensed or regulated is converted into a voltage Vsense 603. The current sense threshold of the circuit of FIG. 6 is the sum of the Vbe2 of Q2 plus the voltage across R3 minus the Vbe1 of Q1. The current sense threshold is therefore substantially equal to the voltage across R3 as Vbe1 of Q1 will cancel the Vbe2 of Q2 to the first order.

Q1 is biased by resistor R4, which has a voltage that is the difference between the forward voltage drop of LED 601 ($V_{BIAS}$) and Vbe1. If the current gain of bipolar transistor Q1 is high, it can be assumed that $I_{R4}$ is substantially equal to $I_{R3}$. The voltage across R3 is therefore substantially a function of the difference between the LED 601 forward voltage drop and the Vbe1 of Q1. Furthermore, if the emitter current density of Q1 and Q2 is substantially equal which can be achieved through the correct selection of resistors R1 and R4, the base emitter voltages Vbe1 and Vbe2 of bipolar transistors Q1 and Q2 will be substantially equal. With the above assumptions, when the current sense circuit input voltage Vsense is equal to the current sense voltage threshold, the following relationships are true:

$$V\text{sense} + V\text{be1} = V_{R3} + V\text{be2} \qquad (1)$$

From above if Vbe1 and Vbe2 are substantially equal in value, equation (1) becomes:

$$V\text{sense} = V_{R3} \qquad (2)$$

From equation (2) and the above assumptions, the current sense threshold is therefore equal to the voltage drop across resistor R3. Since one end of R3 is coupled directly to the base of Q1 and therefore at a base emitter PN junction voltage above the emitter voltage of Q1 and the other end of R3 is coupled to the collector of Q1, the voltage across R3 must be less than Vbe1. The practical range of voltage across R3 and therefore current sense threshold is between zero and (Vbe1-Vcesat1) where Vcesat1 is the minimum collector to emitter voltage of Q1 with a specified collector and base current. Vcesat1 is typically 0.2V and therefore, the voltage across R3 can be no more than approximately 0.5V. Assuming R3 and R4 have substantially the same value of resistance, the base emitter voltage Vbe1 is 0.7V and $V_{BIAS}$ is 1 volt, $V_{R3}$ is 1−0.7=0.3 Volts. Typical values for R4 and R3 are 1000 ohms each. The benefit of the configuration in FIG. 6 is that both the base emitter voltage drops Vbe1 and Vbe2 and therefore their temperature coefficients essentially cancel in equation (1), resulting in a current sense threshold that is substantially a function of the difference between the forward drop of the LED 601 and the forward drop of a PN junction, which is the Vbe1 of Q1. Since PN junction and LED forward voltages have very similar temperature coefficients, which are typically −2.2 mV/° C., the voltage across R3 ($V_{R3}$), which substantially same as the current sense threshold of the circuit in FIG. 6 is relatively temperature independent.

Even when same part types from the same manufacturer are used for Q1 and Q2 the absolute base emitter voltages between Q1 and Q2 (as discussed above with reference to FIG. 5) can different by up to 20 mV in a high volume production environment due to part to part variations. However, this difference will have less influence in this circuit than in the circuit of FIG. 5 since the current sense circuit of FIG. 6 will typically use a current sense threshold voltage of 300 mV and the 20 mV difference in absolute base emitter voltage between Q1 and Q2 will therefore only introduce a small error. In addition, the part to part variations in forward voltage of LED and the Vbe1 of the bipolar transistor Q1 can cause even bigger differences in a production environment as those devices are manufactured in different technologies. This can cause variations in the voltage across R4 and therefore, R3 from one current sense circuit to another. If any of these errors are unacceptable, the values of R4 or R3 can be trimmed in production to reduce or substantially eliminate this error. As discussed before, the absolute base emitter voltage differences between Q1 and Q2 can also be minimized by using a matched pair of discrete or integrated bipolar transistors as will be known to one skilled in the art. The circuit of FIG. 5 is not very sensitive to relative emitter current densities of Q2 and Q1 as it will only introduce a small delta Vbe component in to the current sense threshold. However, in some cases it may be desirable to intentionally introduce a delta Vbe component by unbalancing the emitter current densities of Q1 versus Q2 to compensate any residual temperature variation in the current sense threshold or to obtain a small positive or negative temperature coefficient if required in the application.

Figure 7:
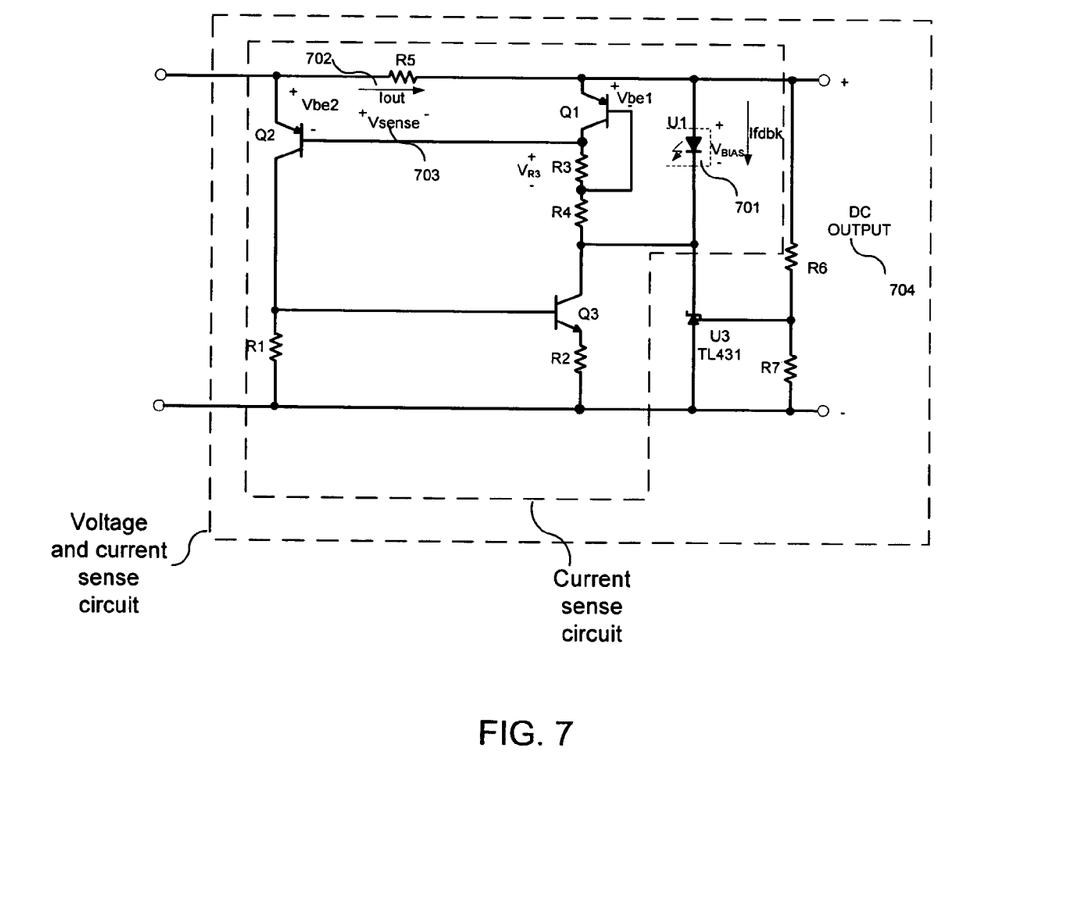
FIG. 7 shows yet another example of a current and voltage sense circuit with an accurate voltage reference for an embodiment in accordance with the teachings of the present invention.

FIG. 7 shows yet another embodiment of a circuit benefiting from the teachings of the present invention. This circuit uses an accurate voltage reference U3 to sense the voltage at the DC output 704 as opposed to low cost zener reference VR1 of FIG. 6. An example of U3 is TL431 voltage reference available from many semiconductor companies such as Texas Instruments, National Semiconductor, etc. One skilled in the art will be familiar with the use of U3 for this purpose and will recognize that in addition to voltage sense components R6 and R7 shown, one or more additional compensation components, including for example capacitors and resistors, may be coupled between the terminals of U3 to provide control loop compensation in a practical circuit configuration. However these components are not shown here so as not to obscure the teachings of the present invention. The significance of the circuit shown in FIG. 7 is that, other than the use of precision reference U3, the electrical performance is equivalent to the circuit of FIG. 6. Since U3 must be referenced to the negative rail of the DC output, it is therefore necessary to use current sense resistor R5 in the positive DC output rail and compared to the circuit of FIG. 6, invert the circuitry of the current sense circuit consisting of components R1, R2, R3, R4, Q1, Q2, Q3 and U3 LED 701 and use PNP bipolar transistors for Q1 and Q2 instead of NPNs used in FIG. 6. The sense circuit in FIG. 7 is an electrical complement of the sense circuit in FIG. 6 and therefore is electrically equivalent with same performance advantages. As would be obvious to one skilled in the art, all of the sense circuits that have discussed previously have compliment circuits that are electrically equivalent and therefore, part of the teachings of this invention.

Figure 8:
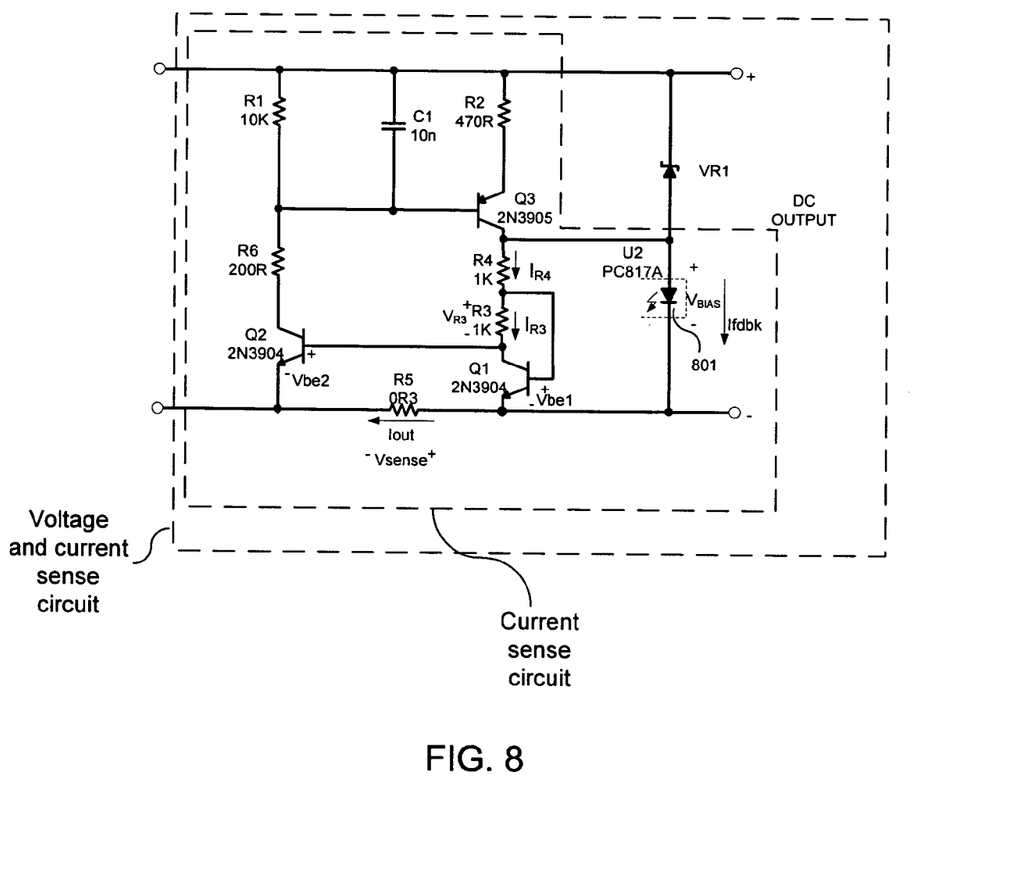
FIG. 8 shows yet another example of a current and voltage sense circuit with example component values for an embodiment in accordance with the teachings of the present invention.

FIG. 8 shows one embodiment of a circuit benefiting from the teachings of the present invention with example component values included. This is a practical implementation of the current sense circuit of FIG. 6 discussed above. Compared to the circuit in FIG. 6, two additional components are added which can be necessary in some applications of the invention in a power supply to prevent undesirable operating behavior. Capacitor C1 and resistor R6 in FIG. 8, both help to avoid the power supply entering the Region 4 in FIG. 2 when this is not desired under transient load conditions. For example, if C1 and R6 are not included and a sudden transient increase in output current demand is applied to the power supply DC output, the current flowing through current sense resistor R5 can transiently exceed the current sense regulation threshold before the power supply control loop has a chance to respond. Under these conditions, the high transient value of Vsense can cause transistor Q1 to saturate and clamp the voltage across LED 801 as described above with reference to FIG. 2. This condition will force the power supply to operate in Region 4. This could be undesirable if the load transient is not intended to be large enough to drive the power supply to operate in this region. C1 and R6 are therefore used to provide a time constant to control the time it takes for Q1 to clamp the voltage across LED 801 and therefore prevent this occurring under short transient load conditions. In other embodiments, R6 could be replaced by a short circuit and C1 increased substantially to achieve a similar result.

In the foregoing detailed description, the methods and apparatuses of the present invention have been described with reference to a specific exemplary embodiment thereof. It will, however, be evident that various modifications and changes may be made thereto without departing from the broader spirit and scope of the present invention. The present specification and figures are accordingly to be regarded as illustrative rather than restrictive.

What is claimed is:

1. A current sense circuit, comprising:
   a current sense resistor coupled to an input of the current sense circuit, the current sense resistor to receive a current to be sensed from the input of the current sense circuit to convert the current to be sensed to a current sense voltage;
   a first PN junction diode coupled to the current sense resistor; and
   a light emitting diode (LED) coupled to the first PN junction diode to provide a current sense threshold substantially equal to a difference between a forward voltage drop of the first PN junction diode and a fraction of a forward voltage drop of the LED, the first PN junction diode coupled to be biased from the forward voltage drop of the LED, the LED coupled to the current sense resistor to generate an output when the current sense voltage from the current sense resistor reaches the current sense threshold.

2. The current sense circuit of claim 1 further comprising a second PN junction diode coupled to the current sense resistor, wherein the current sense threshold is substantially equal to a difference between the forward voltage drop of the the first PN junction diode a fraction of a forward voltage drop of the second PN junction diode.

3. The current sense circuit of claim 2 wherein the first PN junction diode comprises a base emitter junction of a first bipolar transistor coupled to the current sense resistor and the second PN junction diode comprises a base emitter junction of a second bipolar transistor coupled to the current sense resistor.

4. The current sense circuit of claim 3 further comprising a third bipolar transistor coupled to the first bipolar transistor and coupled to the LED, wherein a collector of the first bipolar transistor is coupled to a base of the third bipolar transistor and wherein a collector of the third bipolar transistor is coupled to drive the LED such that an output of the current sense circuit comprises light output generated by the LED.

5. The current sense circuit of claim 4 further comprising a third resistor coupled to an emitter of the third bipolar transistor.

6. The current sense circuit of claim 4 further comprising an optocoupler coupled to the current sense resistor, wherein the optocoupler includes the LED.

7. The current sense circuit of claim 1 further comprising a first resistor coupled between an emitter and a base of a first bipolar transistor including the first PN junction diode, wherein the the fraction of the forward voltage drop of the LED is substantially equal to the voltage across the first resistor.

8. The current sense circuit of claim 7 further comprising a second resistor coupled between the base of the first bipolar transistor and the LED.

9. The current sense circuit of claim 1 wherein the current sense circuit is included in a power supply.

10. The current sense circuit of claim 1 wherein the power supply is an isolated power supply comprising a secondary side circuit including the current sense circuit.

11. A current sense circuit, comprising:
    a current sense resistor coupled to a direct current (DC) output of a power supply, wherein the current sense circuit is to be powered entirely from the DC output, wherein the current sense resistor is to convert a current at the DC output into a current sense voltage; and
    a PN junction diode coupled to the current sense resistor, wherein a current sense threshold is less than a forward voltage of the PN junction diode by a fraction of a forward voltage drop of a light emitting diode (LED) coupled to the PN junction diode, wherein the current sense circuit is to generate an output when the current sense voltage reaches the current sense threshold to sense or regulate the current at the DC output.

12. The current sense circuit of claim 11 wherein the output of the current sense circuit comprises a light output of the LED coupled to the PN junction diode.

13. The current sense circuit of claim 12 wherein the LED is off when an output voltage at the DC output of the power supply is too low.

14. The current sense circuit of claim 11 wherein the current sense threshold is substantially temperature compensated.

15. The current sense circuit of claim 11 wherein the output of the current sense circuit is to be used as a feedback signal to regulate a current at the DC output.

16. The current sense circuit of claim 15 wherein the current at the DC output is maintained substantially at a constant current level over a voltage range at the DC output.

17. The current sense circuit of claim 16 wherein the current at the DC output is reduced below the constant current level outside of the voltage range at the DC output.

18. The current sense circuit of claim 16 wherein a lower limit of the voltage range at the DC output is substantially equal to a sum of a forward drop of a the LED coupled to the PN junction diode and a minimum collector to emitter voltage of a bipolar transistor coupled to drive the LED.

19. The current sense circuit of claim 11 wherein the current sense threshold is substantially constant over a voltage range at the DC output.

20. The current sense circuit of claim 19 wherein a lower limit of the voltage range at the DC output is substantially equal to a sum of a forward drop of the LED coupled to the PN junction diode and a minimum collector to emitter voltage of a bipolar transistor coupled to drive the LED.

* * * * *